United States Patent
Hayashishita (10) Patent No.: US 10,566,254 B2
(45) Date of Patent: *Feb. 18, 2020

(54) METHOD FOR MANUFACTURING SEMICONDUCTOR DEVICE

(71) Applicant: MITSUI CHEMICALS TOHCELLO, INC., Chiyoda-ku, Tokyo (JP)

(72) Inventor: Eiji Hayashishita, Nagoya (JP)

(73) Assignee: MITSUI CHEMICALS TOHCELLO, INC., Chiyoda-Ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/089,782

(22) PCT Filed: Mar. 17, 2017

(86) PCT No.: PCT/JP2017/010890
§ 371 (c)(1),
(2) Date: Sep. 28, 2018

(87) PCT Pub. No.: WO2017/169896
PCT Pub. Date: Oct. 5, 2017

(65) Prior Publication Data
US 2019/0088559 A1    Mar. 21, 2019

(30) Foreign Application Priority Data

Mar. 30, 2016 (JP) ................. 2016-068856

(51) Int. Cl.
*H01L 21/66* (2006.01)
*H01L 21/683* (2006.01)
(Continued)

(52) U.S. Cl.
CPC .............. *H01L 22/20* (2013.01); *C09J 7/255* (2018.01); *C09J 7/29* (2018.01); *C09J 7/385* (2018.01);
(Continued)

(58) Field of Classification Search
None
See application file for complete search history.

(56) References Cited

U.S. PATENT DOCUMENTS

| 9,676,968 B1 | 6/2017 | Nakajima et al. |
| 2004/0191510 A1* | 9/2004 | Kiuchi ................ H01L 21/6835 428/355 RA |

(Continued)

FOREIGN PATENT DOCUMENTS

| JP | 10163281 A | 6/1998 |
| JP | 2012191046 A | 10/2012 |
| WO | 2015174381 A1 | 11/2015 |

OTHER PUBLICATIONS

International Search Report (PCT/ISA/210) dated Jun. 13, 2017, by the Japanese Patent Office as the International Searching Authority for International Application No. PCT/JP2017/010890.

*Primary Examiner* — Angel Roman
(74) *Attorney, Agent, or Firm* — Buchanan, Ingersoll & Rooney PC (57) ABSTRACT

A method for manufacturing a semiconductor device of the present invention includes at least following four steps. (A) A step of preparing a structure having an adhesive film having a radiation-curable adhesive resin layer and one or two or more semiconductor chips adhered to the adhesive resin layer ; (B) a step of irradiating the adhesive film with a radiation to crosslink the adhesive resin layer; (C) a step of, after the step (B), confirming the operation of the semiconductor chips in a state of being adhered to the adhesive resin layer; and (D) a step of, after the step (C), picking up the semiconductor chips from the adhesive resin layer.

10 Claims, 4 Drawing Sheets

(51) Int. Cl.
*H01L 21/78* (2006.01)
*C09J 7/38* (2018.01)
*C09J 7/29* (2018.01)
*C09J 7/25* (2018.01)
*G01R 31/26* (2020.01)

(52) U.S. Cl.
CPC .......... *G01R 31/26* (2013.01); *H01L 21/6836* (2013.01); *H01L 21/78* (2013.01); *C09J 2203/326* (2013.01); *C09J 2433/00* (2013.01); *C09J 2467/006* (2013.01); *H01L 2221/68327* (2013.01); *H01L 2221/68386* (2013.01)

(56) References Cited

U.S. PATENT DOCUMENTS

| | | | | |
|---|---|---|---|---|
| 2009/0020220 | A1* | 1/2009 | Aikawa | B29C 39/148 156/245 |
| 2011/0128628 | A1* | 6/2011 | Kuze | G02B 5/0236 359/599 |
| 2011/0256669 | A1* | 10/2011 | Takamoto | H01L 21/6836 438/118 |
| 2012/0070960 | A1* | 3/2012 | Murata | C09J 133/14 438/464 |
| 2012/0231583 | A1 | 9/2012 | Onishi et al. | |
| 2017/0152407 | A1 | 6/2017 | Nakajima et al. | |

\* cited by examiner

METHOD FOR MANUFACTURING SEMICONDUCTOR DEVICE

TECHNICAL FIELD

The present invention relates to a method for manufacturing a semiconductor device.

BACKGROUND ART

In manufacturing steps of a semiconductor device, after a semiconductor chip is obtained by dicing a semiconductor wafer, a step of operation confirming whether the obtained semiconductor chip operates normally may be performed.

In the operation confirmation step of the semiconductor chip, for example, the operation confirmation of the semiconductor chip is performed at high temperature or low temperature. In doing so, it is possible to accelerate a deterioration of the semiconductor chip in which a factor that may cause a defect is present, to cause an initial defect of the semiconductor chip at an early stage, and to remove the defective product. As a result, a semiconductor chip with excellent reliability with high yield can be obtained.

As a technique related to such an acceleration test of the operation confirmation of semiconductor chip, for example, one described in Patent Document 1 (Japanese Published patent application No. A-H10-163281) can be mentioned.

Patent Document 1 discloses a method for manufacturing a semiconductor element in which dicing is executed to a semiconductor wafer on which a plurality of semiconductor elements are formed, a contact terminal connected to the tester is pressed against an electrode formed on the semiconductor element to make an electrical connection in a state where the positional relationship between the semiconductor elements subjected to the dicing is maintained, and the semiconductor element is manufactured by performing an inspection by operation characteristic test on the semiconductor element by the tester in the connected state.

RELATED DOCUMENT

Patent Document

[Patent Document 1] Japanese Published patent application No. A-H10-163281

SUMMARY OF THE INVENTION

Technical Problem

According to studies of the present inventors, the following problems have been found with respect to the method for manufacturing a semiconductor device in the related art as described in Patent Document 1.

First, the present inventors have found out that in the method for manufacturing a semiconductor device in the related art, in a case of an operation confirmation of a semiconductor chip at high temperature or low temperature, an adhesive film for fixing the semiconductor chip is deformed or melted. In this case, a positional deviation of the semiconductor chip on the adhesive film occurs, or an adhesive force to the semiconductor chip is greatly strengthened, and thereafter, it is difficult to easily pick up the semiconductor chip.

Further, according to the studies of the present inventors, it has become apparent that in a case where a heat resistance of the adhesive film is increased in order to suppress deformation and melting of the adhesive film, deformation and melting of the adhesive film are suppressed, and the positional deviation or strengthening of the adhesive force to the semiconductor chip is reduced, but deterioration of the stretchability and flexibility of the adhesive film is also caused, and thus the semiconductor chip cannot be easily picked up.

That is, the method for manufacturing a semiconductor device in the related art, there is a room for improvement in the pickup performance of the semiconductor chip after the operation confirmation of the semiconductor chip at high temperature or low temperature.

Figure 4:
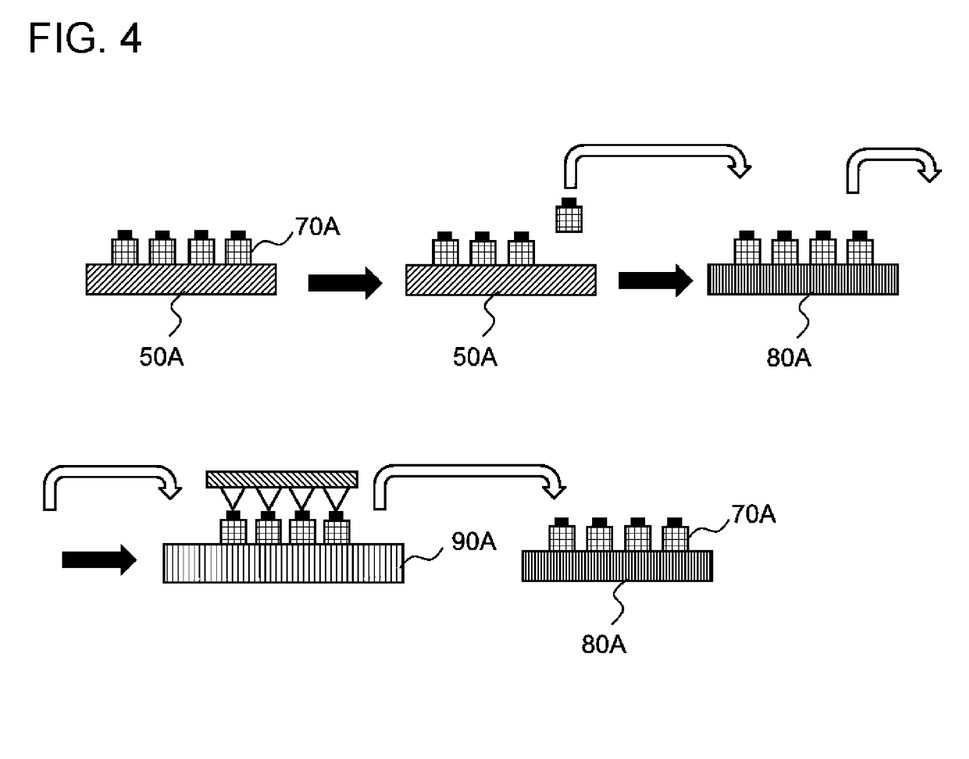
FIG. 4 is a cross-sectional view schematically showing an example of a method for manufacturing a semiconductor device in the related art.

Therefore, in the method for manufacturing a semiconductor device in the related art, from the viewpoint of easily picking up the semiconductor chip, as shown in FIG. 4, a semiconductor chip 70A on an adhesive film 50A is to be once picked up onto a chip tray 80A or the like, the semiconductor chip 70A is to be again transported by a robot and placed on an inspection table 90A, and the operation confirmation of the semiconductor chip at high temperature or low temperature is to be performed, and thereafter the semiconductor chip 70A is to be again picked up onto the chip tray 80A or the like, accordingly, the manufacturing steps are complicated.

That is, the present inventors have found that in the method for manufacturing a semiconductor device in the related art, there is a room for improvement from the viewpoint of compatibility of simplification of steps from the dicing step to the operation confirmation step of the semiconductor chip and pickup performance of the semiconductor chip.

The present invention has been made in view of the above described circumstances, and the present invention is to provide a method for manufacturing a semiconductor device capable of simplifying the steps from the dicing step to the operation confirmation step of a semiconductor chip and picking up the semiconductor chip with a high precision.

Solution to Problem

The present inventors have conducted intensive studies to achieve the above object. As a result, the present inventors found that an adhesive film having a radiation-crosslinking type adhesive resin layer is used as a film for fixing the semiconductor chip, and before the step of confirming the operation of the semiconductor chip, the adhesive resin layer is radiation-crosslinked, and therefore both the simplification of the steps from the dicing step to the operation confirmation step of the semiconductor chip and the pickup performance of the semiconductor chip can be compatible, and completed the present invention.

According to the present invention, there is provided a method for manufacturing a semiconductor device as follows.

[1]

A method for manufacturing a semiconductor device including:

a step (A) of preparing a structure including an adhesive film having a radiation-curable adhesive resin layer, and one or two or more semiconductor chips adhered to the adhesive resin layer;

a step (B) of irradiating the adhesive film with a radiation to crosslink the adhesive resin layer;

a step (C) of, after the step (B), confirming an operation of the semiconductor chips in a state of being adhered to the adhesive resin layer; and a step (D) of, after the step (C), picking up the semiconductor chips from the adhesive resin layer.

[2]

The method for manufacturing a semiconductor device according to [1], in which in the step (C), the operation confirmation of the semiconductor chips is performed under a temperature environment equal to or less than 0° C., or equal to or more than 50° C. and equal to or less than 200° C.

[3]

The method for manufacturing a semiconductor device according to [1] or [2], in which in the step (D), in a state where a region to which the semiconductor chips is adhered in the adhesive resin layer is expanded in an in-plane direction of the film to enlarge an interval between the semiconductor chips adjacent to each other, the semiconductor chips are picked up from the adhesive resin layer.

[4]

The method for manufacturing a semiconductor device according to any one of [1] to [3], in which the adhesive film has a heat-resistant resin layer, a flexible resin layer, and the adhesive resin layer in this order, the method further including:

a step (E) of, after the step (C), peeling the heat-resistant resin layer from the adhesive film.

[5]

The method for manufacturing a semiconductor device according to [4], in which a melting point of the heat-resistant resin layer is equal to or more than 200° C., or the heat-resistant resin layer has no melting point.

[6]

The method for manufacturing a semiconductor device according to [4] or [5], in which a melting point of the flexible resin layer is equal to or more than 100° C. and equal to or less than 250° C.

[7]

The method for manufacturing a semiconductor device according to any one of [4] to [6], in which the heat-resistant resin constituting the heat-resistant resin layer contains one or two or more selected from the group consisting of polyimide, polyamide, and polyester.

[8]

The method for manufacturing a semiconductor device according to any one of [4] to [7], in which the flexible resin constituting the flexible resin layer contains one or two or more selected from the group consisting of a polyester elastomer, a polyamide elastomer, a polyimide elastomer, and a polybutylene terephthalate.

[9]

The method for manufacturing a semiconductor device according to any one of [1] to [8], in which the adhesive constituting the adhesive resin layer contains one or two or more selected from the group consisting of a (meth)acrylate adhesive, a silicone adhesive, a urethane adhesive, an olefin adhesive, and a styrene adhesive.

[10]

The method for manufacturing a semiconductor device according to any one of [1] to [9], in which a total light transmittance of the adhesive film is equal to or more than 85%.

Advantageous Effects Of Invention

According to the present invention, there is provided a method for manufacturing a semiconductor device capable of simplifying steps from dicing step to operation confirmation step of a semiconductor chip and picking up the semiconductor chip with a high precision.

BRIEF DESCRIPTION OF THE DRAWINGS

The above described object and other objects, features, and advantages will become more apparent from the following description of the preferred embodiments and accompanying drawings.

DESCRIPTION OF EMBODIMENTS

Hereinafter, embodiments of the present invention will be described with reference to drawings. In all drawings, the same reference numerals are given to the same configuration elements, and the detailed description thereof will not be repeated. Also, the drawings are schematic ones and do not match the actual dimensions. "A to B" in the numerical range represents A or more and B or less unless otherwise specified. In the present embodiment, "(meth)acrylic" means acrylic or methacrylic or both acrylic and methacrylic.

Figure 1:
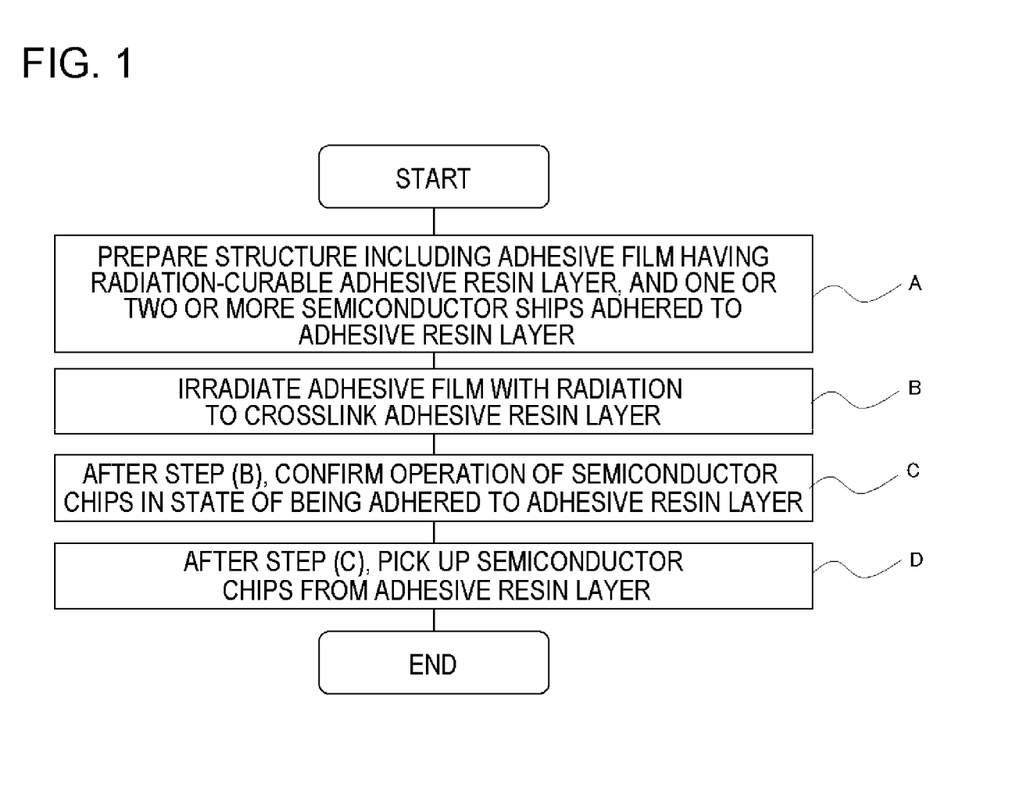
FIG. 1 is a flowchart showing an example of a method for manufacturing a semiconductor device according to the present invention.
Figure 2:
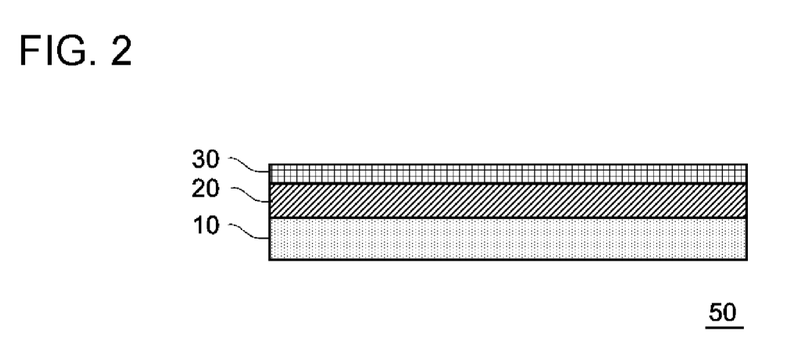
FIG. 2 is a cross-sectional view schematically showing an example of a structure of an adhesive film according to an embodiment of the present invention.
Figure 3:
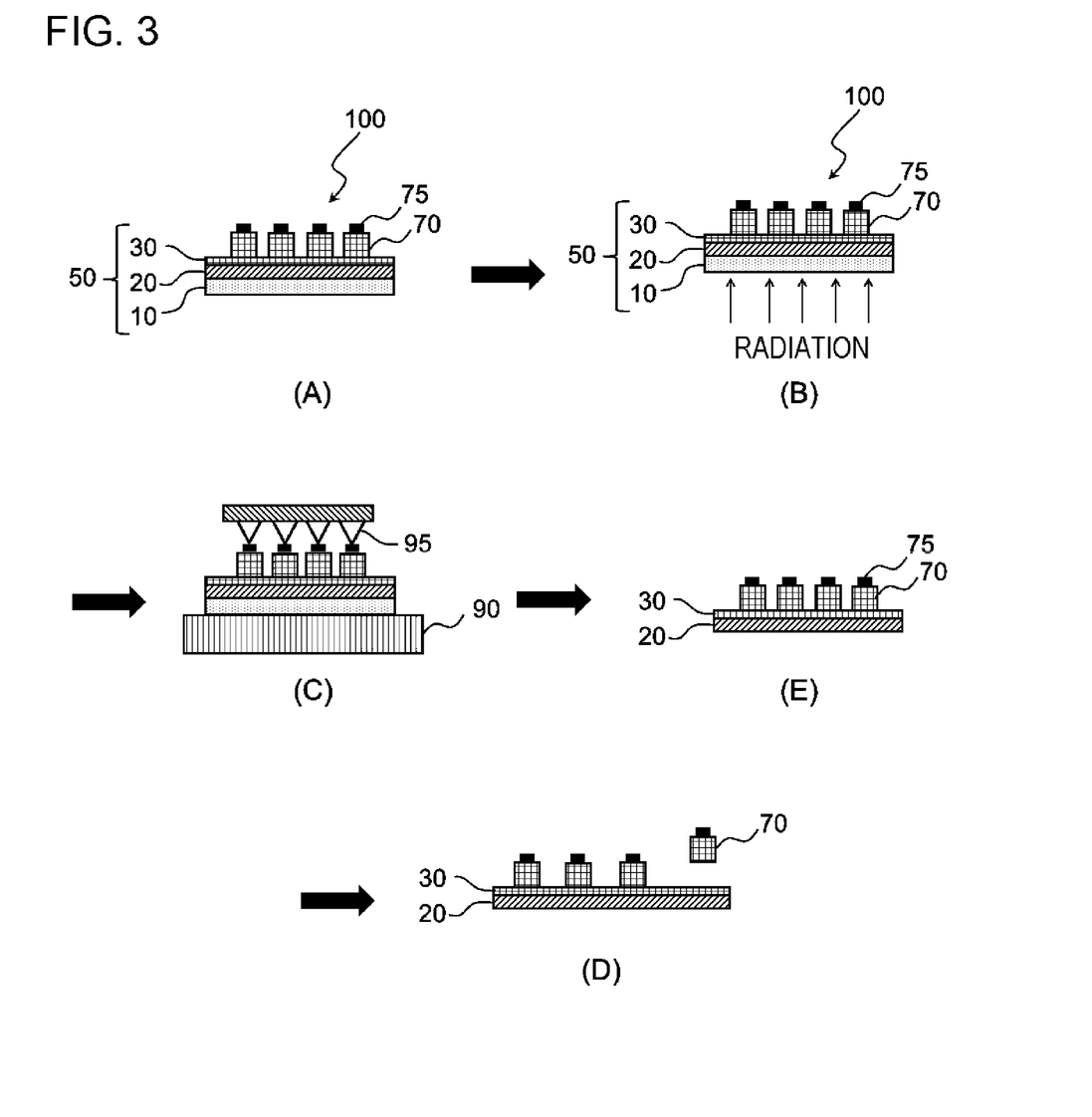
FIG. 3 is a cross-sectional view schematically showing an example of the method for manufacturing a semiconductor device according to an embodiment of the present invention.

FIG. 1 is a flowchart showing an example of a method for manufacturing a semiconductor device according to the present invention. FIG. 2 is a cross-sectional view schematically showing an example of a structure of an adhesive film 50 according to an embodiment of the present invention. FIG. 3 is a cross-sectional view schematically showing an example of the method for manufacturing a semiconductor device according to an embodiment of the present invention.

The method for manufacturing a semiconductor device according to the present embodiment includes at least the following four steps:

(A) a step of preparing a structure 100 including an adhesive film 50 having a radiation-curable adhesive resin layer 30, and one or two or more semiconductor chips 70 adhered to the adhesive resin layer 30;

(B) a step of irradiating the adhesive film 50 with a radiation to crosslink the adhesive resin layer 30;

(C) a step of, after the step (B), confirming an operation of the semiconductor chips 70 in a state of being adhered to the adhesive resin layer 30; and (D) a step of, after the step (C), picking up the semiconductor chips 70 from the adhesive resin layer 30.

According to the studies of the present inventors, the following problems have been found from the method for manufacturing a semiconductor device in the related art.

First, the present inventors have found out that in the method for manufacturing a semiconductor device in the related art, in a case of the operation confirmation of the semiconductor chip at high temperature or low temperature, the adhesive film for fixing the semiconductor chip is deformed or melted. In this case, the positional deviation of the semiconductor chip on the adhesive film occurs, or the adhesive force to the semiconductor chip is greatly strengthened, and therefore it is difficult to easily pick up the subsequent semiconductor chip.

Further, according to the studies of the present inventors, it has become apparent that in a case where the heat resistance of the adhesive film is increased in order to suppress deformation and melting of the adhesive film, deformation and melting of the adhesive film are suppressed, and the positional deviation or strengthening of the adhesive force to the semiconductor chip is reduced, but deterioration of the stretchability and flexibility of the adhesive film is also caused, and thus the semiconductor chip cannot be easily picked up.

That is, in the method for manufacturing a semiconductor device in the related art, there is a room for improvement in the pickup performance of the semiconductor chip after the operation confirmation of the semiconductor chip at high temperature or low temperature.

In other words, from the viewpoint of easily picking up the semiconductor chip, in the method for manufacturing a semiconductor device in the related art, the semiconductor chips are subjected to complicated steps in which a semiconductor chip 70A on an adhesive film 50A is once picked up onto a chip tray 80A or the like, the semiconductor chip 70A is again transported by a robot and placed on an inspection table 90A, and operation confirmation of the semiconductor chip at high temperature or low temperature is performed, and thereafter the semiconductor chip 70A have to be picked up again onto the chip tray 80A or the like, as shown in FIG. 4.

That is, the present inventors have found that in the method for manufacturing a semiconductor device in the related art, there is a room for improvement from the viewpoint of compatibility of simplification of steps from the dicing step to the operation confirmation step of the semiconductor chip and pickup performance of the semiconductor chip.

The present inventors have conducted intensive studies to achieve the above object and as a result, have found that by using an adhesive film 50 having a radiation cross-linking type adhesive resin layer 30 as a film for fixing the semiconductor chip, and radiation-crosslinking the adhesive resin layer 30 before a step of confirming the operation of a semiconductor chip 70 compatibility of simplification of steps from the dicing step to the operation confirmation step of the semiconductor chip and the pickup property of the semiconductor chip can be achieved.

That is, by performing the above step (C) using the adhesive film 50 having a heat resistance improved by crosslinking the adhesive resin layer 30, deformation and melting of the adhesive resin layer 30 are suppressed and the positional deviation of the semiconductor chip 70 and strengthening of the adhesive force to the semiconductor chip can be suppressed, whereby precise picking up of the semiconductor chip 70 in step (D) is realized.

Furthermore, since it is possible to confirm the operation of the semiconductor chip 70 in a state of being adhered to the adhesive film 50 at high temperature or low temperature, it is unnecessary to pick up the semiconductor chip 70 from the adhesive film 50 and to move it to a chip tray or the like before operation confirmation of the semiconductor chip 70 and steps from dicing step to operation confirmation step of the semiconductor chip can be simplified.

As described above, according to the method for manufacturing a semiconductor device in the present embodiment, by including the steps (A) to (D), steps from dicing step to operation confirmation step of the semiconductor chip can be simplified and thus picking up the semiconductor chip with a high precision is realized.

1. Adhesive Film

First, an adhesive film 50 used in the method for manufacturing a semiconductor device according to the present embodiment will be described.

The adhesive film 50 has at least a radiation-crosslinking type adhesive resin layer 30. Further, in addition to the adhesive resin layer 30, the adhesive film 50 may further have at least one of a heat-resistant resin layer 10 and a flexible resin layer 20, and it is preferable that the adhesive film 50 has both the heat-resistant resin layer 10 and the flexible resin layer 20 from the viewpoint of further improving the balance between heat resistance and flexibility of the adhesive film 50.

In a case where the adhesive film 50 includes the adhesive resin layer 30, the heat-resistant resin layer 10, and the flexible resin layer 20, as shown in FIG. 2, it is preferable that the adhesive film 50 have the heat-resistant resin layer 10, the flexible resin layer 20, and the adhesive resin layer 30 in this order.

This configuration with the heat-resistant resin layer 10 prevents deformation and melting of the adhesive resin layer 30 and prevents the positional deviation of the semiconductor chip 70 and strengthening of the adhesive force to the semiconductor chip, whereby precise picking up of the semiconductor chip 70 in step (D) is realized. That is, the balance between adherence property, heat resistance, and flexibility of the adhesive film 50 is improved.

Here, in the present embodiment, the term "heat resistance" means a dimensional stability of a film or a resin layer at high temperature or low temperature. That is, a film or a resin layer having excellent heat resistance means that the film or the resin layer is less likely to have deformation or melting such as expansion, contraction, softening, or the like at high temperature or low temperature.

<Adhesive Resin Layer>

The adhesive resin layer 30 is a radiation-crosslinking type layer, and is a layer which comes in contact with and adheres to a surface of a semiconductor substrate in a case where the adhesive film 50 is adhered to the semiconductor substrate.

Examples of the adhesive constituting the adhesive resin layer 30 include a (meth) acrylic adhesive, a silicone adhesive, a urethane adhesive, an olefin adhesive, and a styrene adhesive. Among them, a (meth) acrylic adhesive containing a (meth) acrylic polymer as abase polymer is preferable from the viewpoint of easy adjustment of the adhesive force and the like.

As the adhesive constituting the adhesive resin layer 30, a radiation-crosslinking type adhesive which crosslinks by radiation irradiation is used. Since the adhesive resin layer 30 constituted by the radiation-crosslinking type adhesive is crosslinked by radiation irradiation and improves the heat resistance, the deformation and the melting of the adhesive resin layer 30 is suppressed in the step (C) and thus the positional deviation of the chip 70 and strengthening of the adhesive force to the semiconductor chip can be suppressed. As the radiation, ultraviolet rays, electron beams, and infrared rays, and the like can be mentioned.

As the radiation-crosslinking type adhesive, an ultraviolet-crosslinking type adhesive is preferable.

As the (meth)acrylic polymer contained in the (meth) acrylic adhesive, for example, a homopolymer of a (meth) acrylic acid ester compound and a copolymer of a (meth) acrylic acid ester compound and a comonomer and the like. Examples of the (meth)acrylic acid ester compound include methyl (meth)acrylate, ethyl (meth)acrylate, butyl (meth) acrylate, 2-ethylhexyl (meth)acrylate, hydroxyethyl (meth) acrylate, hydroxypropyl (meth) acrylate, dimethylaminoethyl (meth)acrylate, and glycidyl (meth)acrylate. These (meth)acrylic acid ester compounds may be used singly or in a combination of two or more thereof.

Examples of comonomers constituting the (meth) acrylic copolymer include vinyl acetate, (meth)acrylonitrile, styrene, (meth)acrylic acid, itaconic acid, (meth)acrylamide, methylol (meth)acrylamide, and maleic anhydride. These comonomers may be used singly or in a combination of two or more thereof.

The radiation-crosslinking type adhesive includes, for example, an adhesive such as a (meth) acrylic adhesive, a crosslinking compound (a component having a carbon-carbon double bond), and a photopolymerization initiator or a thermal polymerization initiator.

Examples of the crosslinking compound include monomers, oligomers, and polymers having a carbon-carbon double bond in the molecule and being crosslinkable by radical polymerization. Examples of such crosslinking compounds include esters of (meth) acrylic acid and polyhydric alcohol such as trimethylolpropane tri(meth)acrylate, pentaerythritol tri(meth)acrylate, tetraethylene glycol di(meth) acrylate, 1,6-hexanediol di(meth)acrylate, neopentyl glycol di(meth)acrylate, and dipentaerythritol hexa(meth)acrylate; ester (meth)acrylate oligomer; and isocyanurate or isocyanurate compounds such as 2-propenyl-di-3-butenyl cyanurate, 2-hydroxyethyl bis(2-(meth)acryloxyethyl)isocyanurate, tris(2-methacryloxyethyl)isocyanurate.

In a case where the adhesive is a radiation-crosslinking type polymer having a carbon-carbon double bond in the side chain of the polymer, a crosslinking compound may not be added.

The content of the crosslinking compound is preferably from 5 to 900 parts by mass, more preferably from 5 to 100 parts by mass, still more preferably from 10 to 50 parts by mass, with respect to 100 parts by mass of the adhesive. In a case where the content of the crosslinking compound is within the above range, the adhesive force is adjusted more easily compared to in a case of being less than the above range, and the deterioration of storage stability due to too high sensitivity to heat or light is less likely to occur compared to in a case of being larger than the above range.

As the photopolymerization initiator, any compound to which radiation irradiation cleaves a bond and generates radicals may be used. Examples of the photopolymerization initiator include benzoin alkyl ethers such as benzoin methyl ether, benzoin isopropyl ether, and benzoin isobutyl ether; aromatic ketones such as benzyl, benzoin, benzophenone, α-hydroxycyclohexyl phenyl ketone; aromatic ketals such as benzyl dimethyl ketal; and polyvinyl benzophenone; thioxanthones such as chlorothioxanthone, dodecyl thioxanthone, dimethyl thioxanthone, and diethyl thioxanthone.

Examples of the thermal polymerization initiator include organic peroxide derivatives, and azo polymerization initiators. From the viewpoint that nitrogen is not generated upon heating, an organic peroxide derivative is preferable.

Examples of the thermal polymerization initiator include ketone peroxide, peroxyketal, hydroperoxide, dialkyl peroxide, diacyl peroxide, peroxyester, and peroxydicarbonate.

A crosslinking agent may be added to the adhesive. Examples of the crosslinking agent include epoxy compounds such as sorbitol polyglycidyl ether, polyglycerol polyglycidyl ether, pentaerythritol polyglycidyl ether, and diglycerol polyglycidyl ether; aziridine compounds such as tetramethylolmethane tri-β-aziridinyl propionate, trimethylolpropane tri-β-aziridinyl propionate, N,N'-diphenylmethane-4,4'-bis(1-aziridinecarboxamide), and N,N'-hexamethylene-1,6-bis(1-aziridinecarboxamide); and isocyanate compounds such as tetramethylene diisocyanate, hexamethylene diisocyanate, and polyisocyanate.

The content of the crosslinking agent is preferably equal to or more than 0.1 part by mass and equal to or less than 10 parts by mass with respect to 100 parts by mass of the (meth) acrylic polymer from the viewpoint of improving the balance with heat resistance and adhesion force of the adhesive resin layer 30.

The thickness of the adhesive resin layer 30 is not particularly limited, and preferably equal to or more than 1 μm and equal to or less than 100 μm, more preferably equal to or more than 3 μm and equal to or less than 50 μm, for example.

The adhesive resin layer 30 may be formed, for example, by applying an adhesive coating solution onto a base material layer, the heat-resistant resin layer 10, and the flexible resin layer 20.

As a method for applying the adhesive coating solution, coating methods in the known related art such as a roll coater method, a reverse roll coater method, a gravure roll method, a bar coat method, a comma coater method, and a die coater method can be adopted. The drying condition of the applied adhesive is not particularly limited, and it is typically preferable to dry in the temperature range of 80° C. to 200° C. for 10 seconds to 10 minutes. It is more preferable to dry at 80° C. to 170° C. for 15 seconds to 5 minutes. In order to sufficiently accelerate the crosslinking reaction between the crosslinking agent and the adhesive, heating may be performed at 40° C. to 80° C. for about 5 to 300 hours after the drying of the adhesive coating solution is completed.

<Heat-Resistant Resin Layer>

The heat-resistant resin layer 10 is a layer provided for the purpose of further improving properties such as handleability, mechanical properties, and heat resistance of the adhesive film 50.

The heat-resistant resin layer 10 is not particularly limited as long as it has heat resistance enough to prevent deformation and melting to such an extent that positional deviation of the semiconductor chip occurs in a case where confirming the operation of the semiconductor chip at high temperature or low temperature. For example, heat resistant resin film may be used.

Examples of the resin constituting the heat-resistant resin film include one or two or more selected from the group consisting of polyesters such as polyethylene terephthalate, polybutylene terephthalate, and polyethylene naphthalate; polyamides such as nylon-6, nylon-66, and polymetaxylene adipamide; polyimide; polyetherimide; polyamide imide; polycarbonate; modified polyphenylene ether; polyacetal; polyallylate; polysulfone; polyethersulfone; polyphenylene sulfide; polyetheretherketone; fluorine resin; liquid crystal polymer; vinylidene chloride resin; polybenzimidazole; polybenzoxazole; and poly methyl pentene.

Among them, one or two or more selected from the group consisting of polyimide, polyamide, and polyester are preferable from the viewpoint of excellent balance of heat resistance, mechanical strength, transparency, price, and the like.

The melting point of the heat-resistant resin layer 10 is preferably equal to or more than 200° C., and more preferably equal to or more than 220° C. Alternatively, the heat-resistant resin layer 10 preferably has no melting point, more preferably has a decomposition temperature of equal to or more than 200° C., and still more preferably has a decomposition temperature of equal to or more than 220° C.

By using such a heat-resistant resin layer 10, the deformation of the adhesive film 50 can further be suppressed in a case of the operation confirmation test at high temperature or low temperature.

The heat-resistant resin layer 10 may be single layered or two or more layered.

The form of the resin film used for forming the heat-resistant resin layer 10 maybe a stretched film or a film stretched in a uniaxial direction or biaxial direction, and it is preferable that the film be stretched in the uniaxial direction or the biaxial direction from the viewpoint of improving the heat resistance and the mechanical strength of the heat-resistant resin layer 10.

The thickness of the heat-resistant resin layer 10 is preferably equal to or more than 10 μm and equal to or less than 1000 μm, more preferably equal to or more than 10 μm and equal to or less than 500 μm, still more preferably equal to or more than 20 μm and equal to or less than 300 μm, from the viewpoint of obtaining favorable film characteristics.

The heat-resistant resin layer 10 may be subjected to a surface treatment in order to improve the adhesiveness to other layers. Specifically, corona treatment, plasma treatment, undercoat treatment, primer coating treatment, and the like may be performed.

It is preferable that the heat-resistant resin layer 10 be laminated on the flexible resin layer 20 in a peelable way.

The method for stacking in a peelable way is not particularly limited, and for example, a method for stacking through a peelable adhesive layer (not shown), and a method for adjusting the surface roughness of the surface of the heat-resistant resin layer 10 on the side in contact with the flexible resin layer 20 and having the surface thereof subjected to release treatment, and the like can be mentioned. The term "peelable adhesive layer" refers to a layer that can be easily peeled by any sort of application of stimulation such as radiation or heat during peeling.

Examples of such a peelable adhesive layer include (1) an adhesive layer composed of a radiation-crosslinking type adhesive which can suppress the strengthening of the adhesive force by irradiation of radiation, (2) an adhesive layer constituted by a heat-expansion type adhesive which is allowed to expand upon heating and suppress the strengthening of the adhesive force (3) an adhesive layer which is constituted by a double-sided adhesive film with a shrinkable film as a base material, is shrunk by heating, and can suppress the strengthening of the adhesive force, and (4) a heat-resistant adhesive layer which can suppress the strengthening of the adhesive force even after treatment at high temperature or low temperature.

((1) Adhesive Layer Constituted by Radiation-Crosslinking Type Adhesive Capable of Suppressing Strengthening of Adhesive Force by Radiation Irradiation)

The radiation-crosslinking type adhesive has sufficient adhesive force to the heat-resistant resin layer 10 and the flexible resin layer 20 before the radiation irradiation and can suppress strengthening of the adhesive force after the radiation irradiation. That is, the heat-resistant resin layer 10 and the flexible resin layer 20 can be adhered to each other before the radiation irradiation, and the heat-resistant resin layer 10 can be easily peeled from the flexible resin layer 20 after the radiation irradiation.

As the radiation-crosslinking type adhesive, typically, a radiation-crosslinking type adhesive such as a known ultraviolet-crosslinking type adhesive or the like may be used.

((2) Adhesive Layer Constituted by Heat-Expansion Type Adhesive Capable of Suppressing Strengthening of Adhesive Force by Layer Expanding Upon Heating)

The term "heat-expansion type adhesive" refers to an adhesive in which thermally expandable fine particles, a blowing agent, or the like is dispersed in an adhesive. As the adhesive, generally known adhesives may be used, and examples thereof include (meth)acrylic adhesives, silicone adhesives, rubber adhesives, polyurethane adhesives, and polyvinyl ether adhesives.

As the thermally expandable fine particles, for example, fine particles in which a material that can be easily gasified and expanded by heating such as isobutane, propane, pentane, or the like is enclosed in an elastic shell can be mentioned.

As the blowing agent, for example, chemical substances having the ability to generate water, carbon dioxide gas, nitrogen by pyrolysis, and the like can be mentioned.

In a case where the thermally expandable fine particles and the blowing agent are expanded by heating, the surface state of the adhesive layer changes, and thus the strengthening of the adhesive force between the flexible resin layer 20 and the heat-resistant resin layer 10 can be suppressed. As a result, the heat-resistant resin layer 10 can be easily peeled from the flexible resin layer 20.

((3) Adhesive Layer Constituted by a Double-Sided Adhesive Film with a Shrinkable Film as a Base Material, and Capable of Suppressing Strengthening of Adhesive Force by Shrinkage Upon Heating)

As a shrinkable film used for a double-sided adhesive film with a shrinkable film as a base material, a heat shrinkable film shrinking by heating can be mentioned. An uniaxial or biaxially stretched films formed of, for example, polyethylene terephthalate, polyethylene, polystyrene, polypropylene, polyamide, polyurethane, polyvinyl chloride, polyvinylidene chloride or the like can be mentioned.

As the adhesive provided on both sides of the shrinkable film, generally known adhesives may be used; examples thereof include (meth)acrylic adhesives, silicone adhesives, rubber adhesives, polyurethane adhesives, and polyvinyl ether adhesives.

In a case where the shrinkable film of the base material shrinks upon heating, the surface state of the adhesive layer changes, and thus strengthening of the adhesive force between the flexible resin layer 20 and the heat-resistant resin layer 10 can be suppressed. As a result, the heat-resistant resin layer 10 can be easily peeled from the flexible resin layer 20.

((4) Heat-Resistant Adhesive Layer Capable of Suppressing Strengthening of Adhesive Force Even After Treatment at High Temperature or Low Temperature)

Examples of an adhesive constituting a heat-resistant adhesive layer which can suppress the strengthening of the adhesive force even after treatment at high temperature or low temperature include a (meth)acrylic adhesive, a silicone adhesive, a urethane adhesive, an olefin adhesive, and a styrene adhesive.

Here, the (meth)acrylic adhesive contains a (meth)acrylic adhesive resin as an essential component. The silicone adhesive contains a silicone adhesive resin as an essential component. The urethane adhesive contains a urethane adhesive resin an essential component.

Among them, a (meth)acrylic adhesive is preferable from the viewpoint of easier adjustment of the peeling strength between the heat-resistant resin layer 10 and the flexible resin layer 20.

Examples of the (meth)acrylic adhesive resin used in the (meth)acrylic adhesive include a (meth)acrylic acid alkyl ester monomer unit (A) and a monomer unit (B) having a functional group capable of reacting with a crosslinking agent.

In the present embodiment, the (meth)acrylic acid alkyl ester means an acrylic acid alkyl ester, a methacrylic acid alkyl ester, or a mixture thereof.

The (meth)acrylic adhesive resin according to the present embodiment can be obtained by copolymerizing a monomer mixture containing a (meth) acrylic acid alkyl ester monomer (A) and a monomer (B) having a functional group capable of reacting with a crosslinking agent.

As the monomer (A) forming the (meth)acrylic acid alkyl ester monomer unit (A), (meth) acrylic acid alkyl ester having an alkyl group having about 1 to 12 carbon atoms can be mentioned. (Meth) Acrylic acid alkyl ester having an alkyl group having 1 to 8 carbon atoms is preferable. Specifically, examples thereof include methyl acrylate, methyl methacrylate, ethyl acrylate, ethyl methacrylate, butyl acrylate, butyl methacrylate, 2-ethylhexyl acrylate, and 2-ethylhexyl methacrylate. These may be used singly, or two or more thereof may be used.

In the (meth)acrylic adhesive resin according to the present embodiment, the content of the (meth) acrylic acid alkyl ester monomer unit (A) is preferably equal to or more than 10% by mass and equal to or less than 98.9% by mass, and more preferably equal to or more than 85 mass % and equal to or less than 95 mass %, with respect to the total of all the monomer units in the (meth) acrylic adhesive resin as 100% by mass.

As the monomer (B) forming the monomer unit (B) having a functional group capable of reacting with the crosslinking agent, acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylate, acrylamide, methacrylamide, tert-butylaminoethyl acrylate, and tert-butylaminoethyl methacrylate. Acrylic acid, methacrylic acid, 2-hydroxyethyl acrylate, 2-hydroxyethyl methacrylate, acrylamide, methacrylamide and the like are preferable. These may be used singly, or two or more thereof may be used.

In the (meth)acrylic adhesive resin according to the present embodiment, the content of the monomer unit (B) is preferably equal to or more than 1% by mass and equal to or less than 40% by mass, more preferably equal to or more than 1% by mass and equal to or less than 20% by mass, and still more preferably equal to or more than 1% by mass and equal to or less than 10% by mass, with respect to the total of all the monomer units in the (meth) acrylic adhesive resin as 100% by mass.

In addition to the monomer unit (A) and the monomer unit (B), the (meth) acrylic adhesive resin according to the present embodiment may further contain a bifunctional monomer (C) or a specific comonomer having properties as a surfactant (hereinafter referred to as polymerizable surfactant) unit.

The polymerizable surfactant has a property of being copolymerized with the monomer (A), the monomer (B), and the monomer (C), and acts as an emulsifier in a case of emulsion polymerization.

Examples of the monomer (C) forming the bifunctional monomer unit (C) include allyl methacrylate, allyl acrylate, divinylbenzene, vinyl methacrylate, vinyl acrylate, trimethylolpropane tri (meth) acrylate, pentaerythritol tri (meth) acrylate, dipentaerythritol hexa (meth) acrylate, tetraethylene glycol di (meth) acrylate and ones in which with diacrylate or dimethacrylate at both ends, the main chain has propylene glycol type structure (for example, manufactured by NOF Corporation, trade name: PDP-200, PDP-400, ADP-200, ADP-400), tetramethylene glycol type structure (for example, manufactured by NOF Corporation, trade name: ADT-250 and ADT-850), and mixed type thereof (for example, manufactured by NOF Corporation, trade name: ADET-1800, ADPT-4000).

In the (meth)acrylic adhesive resin according to the present embodiment, the content of the monomer unit (C) is preferably equal to or more than 0.1% by mass and equal to or less than 30% by mass, more preferably equal to or more than 0.1% by mass to equal to or less than 5% by mass, with respect to the total of all the monomer units in the (meth) acrylic adhesive resin as 100% by mass.

Examples of the polymerizable surfactant include those obtained by introducing polymerizable 1-propenyl group to the benzene ring of polyoxyethylene nonylphenyl ether (manufactured by DKS Co. Ltd., trade name: Aqualon RN-10, RN-20, RN-30, RN-50, and the like), those obtained by introducing polymerizable 1-propenyl group into the benzene ring of an ammonium salt of sulfuric acid ester of polyoxyethylene nonylphenyl ether (manufactured by DKS Co. Ltd., trade name: Aqualon HS-10, HS-20, HS-1025, and the like), and sulfosuccinic acid diester having a polymerizable double bond in the molecule (manufactured by Kao Corporation trade name: Latemul S-120A, S-180A, and the like).

The (meth)acrylic adhesive resin according to the present embodiment may further contain a monomer unit formed of a monomer having a polymerizable double bond such as vinyl acetate, acrylonitrile, and styrene if necessary.

Examples of the polymerization reaction mechanism of the (meth)acrylic adhesive resin according to the present embodiment include radical polymerization, anionic polymerization, and cationic polymerization. Considering the production cost of the (meth)acrylic adhesive resin, the influence of the functional group of the monomer, and the like, it is preferable to polymerize by radical polymerization.

In a case of the polymerization by a radical polymerization reaction, examples of radical polymerization initiator include organic peroxides such as benzoyl peroxide, di-t-butyl peroxide, dicumyl peroxide, 3,3,5-trimethylhexanoyl peroxide, di-2-ethylhexylperoxy dicarbonate, methyl ethyl ketone peroxide, t-butyl peroxy phthalate, t-butyl peroxybenzoate, di-t-butyl peroxyacetate, t-butyl peroxy isobutvrate, t-butyl peroxy-2-hexanoate, t Butyl peroxy-2-ethyl hexanoate, t-butyl peroxy-3,5,5-trimethyl hexanoate, acetyl peroxide, isobutyryl peroxide, octanoyl peroxide, t-butyl peroxide and di-t-amyl peroxide; inorganic peroxides such as ammonium persulfate, potassium persulfate, sodium persulfate and the like; and azo compounds such as 2,2'-azobisisobutyronitrile, 2,2'-azobis-2-methylbutyronitrile, and 4,4'-azobis-4-cyanovaleric acid.

In a case of polymerization by emulsion polymerization, among these radical polymerization initiators, inorganic peroxides such as water-soluble ammonium persulfate, potassium persulfate, sodium persulfate and the like, and an azo compound having a carboxyl group in the molecule such as water-soluble 4,4'-azobis-4-cyanovaleric acid is preferable, azo compounds having a carboxyl group in the molecule such as ammonium persulfate and 4,4'-azobis-4-cyanovaleric acid is more preferable, and azo compounds having a carboxyl group in the molecule such as 4,4'-azobis-4-cyanovaleric acid are particularly preferable.

In addition to the (meth)acrylic adhesive resin, the (meth)acrylic adhesive preferably further contains a crosslinking agent having two or more crosslinking functional groups in one molecule.

A crosslinking agent having two or more crosslinking functional groups in one molecule is used for reacting with a functional group of the (meth)acrylic adhesive resin and adjusting the adhesive force and the cohesive force.

Examples of such a crosslinking agent include epoxy compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, resorcinol dialvcidvl ether and the like; isocyanate compounds such as tetramethylene diisocyanate, hexamethylene diisocyanate, tolylene diisocyanate 3 adduct of trimethylol propane, polyisocyanate, diphenylmethane diisocyanate, tolylene diisocyanate and the like; aziridine compounds such as trimethylolpropane tri-β-aziridinyl propionate, tetramethylolmethane-tri-β-aziridinyl propionate, N,N'-diphenylmethane-4,4'-bis(1-aziridinecarboxamide), N,N'-hexamethylene-1,6-bis(1-aziridinecarboxamide), N,N'-toluene-2,4-bis(1-aziridinecarboxamide), trimethylolpropane-tri-β-(2-methylaziridine) propionate and the like; tetrafunctional epoxy compounds such as N,N,N',N'-tetraglycidyl-m-xylenediamine and 1,3-bis (N,N'-diglycidylaminomethyl) cyclohexane; and melamine compounds such as hexamethoxymethylol melamine. These may be used singly, or in combination of two or more thereof.

Among these, it is preferable that one or two or more selected from the group consisting of an epoxy compound, an isocyanate compound, and an aziridine compound be contained.

The content of the crosslinking agent in the (meth)acrylic adhesive is preferably equal to or more than 10 parts by mass and equal to or less than 50 parts by mass, more preferably equal to or more than 12 parts by mass and equal to or less than 30 parts by mass with respect to 100 parts by mass of the (meth)acrylic resin from the viewpoint of improving the balance with heat resistance and adhesive force of the adhesive layer.

By adjusting the content of the crosslinking agent in the (meth)acrylic adhesive, the peeling strength between the heat-resistant resin layer 10 and the flexible resin layer 20 can be adjusted.

The (meth)acrylic adhesive according to the present embodiment may further contain an ultraviolet polymerization initiator in addition to the adhesive resin. In doing so, the curing time and ultraviolet radiation dose by ultraviolet radiation can be reduced.

Examples of ultraviolet polymerization initiators include acetophenone based photopolymerization initiators such as methoxy acetophenone, α-ketol compounds such as 4-(2-hydroxyethoxy) phenyl (2-hydroxy-2-propyl) ketone; ketal compounds such as benzyl dimethyl ketal; benzoin based photopolymerization initiators such as benzoin, benzoin methyl ether, benzoin ethyl ether, and benzoin isopropyl ether; and benzophenone based photopolymerization initiators such as benzophenone and benzoyl benzoic acid.

The content of the ultraviolet polymerization initiator in the adhesive is preferably equal to or more than 0.1 part by mass and equal to or less than 10 parts by mass, more preferably equal to or more than 2.5 parts by mass and equal to or less than 5 parts by mass with respect to 100 parts by mass of the adhesive resin.

The thickness of the adhesive layer is not particularly limited, and is preferably equal to or more than 1 μm and equal to or less than 100 μm, more preferably equal to or more than 3 μm and equal to or less than 50 μm, for example.

The adhesive layer may be formed, for example, by applying an adhesive coating solution on the heat-resistant resin layer 10 or the flexible resin layer 20.

As a method for applying the adhesive coating solution, coating methods in the known related art such as a roll coater method, a reverse roll coater method, a gravure roll method, a bar coat method, a comma coater method, a die coater method and the like may be adopted. The drying condition of the applied adhesive is not particularly limited, and it is generally preferable to dry in the temperature range of 80 to 200° C. for 10 seconds to 10 minutes. It is more preferable to dry at 80 to 170° C. for 15 seconds to 5 minutes. In order to sufficiently accelerate the crosslinking reaction between the crosslinking agent and the adhesive, heating may be performed at 40 to 80° C. for about 5 to 300 hours after the drying of the adhesive coating solution is completed.

Also in the adhesive film 50 according to the present embodiment, the peeling strength between the heat-resistant resin layer 10 and the flexible resin layer 20 can be adjusted by adjusting the surface roughness of the surface of the heat-resistant resin layer 10 on the side in contact with the flexible resin layer 20 and by subjecting the surface thereof to release treatment.

Here, the surface roughness (Ra) of the surface of the heat-resistant resin layer 10 which is in contact with the flexible resin layer 20 as defined by JIS-B0601 is preferably equal to or more than 0.10 μm and equal to or less than 10 μm.

It is also preferable that the surface of the heat-resistant resin layer 10 on the side in contact with the flexible resin layer 20 is subjected to release treatment with a releasing agent such as silicone or polytetrafluoroethylene.

(Flexible Resin Layer)

The flexible resin layer 20 is a layer provided for the purpose of improving properties such as flexibility and stretchability of the adhesive film 50.

By providing the flexible resin layer 20, the stretchability and flexibility of the adhesive film 50 after peeling of the heat-resistant resin layer 10 are improved and the adhesive film 50 is allowed to expand in the in-plane direction in the step (D) of picking up the semiconductor chip 70.

In doing so, since the interval between adjacent semiconductor chips 70 is enlarged, the semiconductor chip 70 can be easily picked up from the adhesive film 50. Furthermore, since the adhesive force between the semiconductor chip 70 and the adhesive resin layer 30 is lowered by the shear stress between the semiconductor chip 70 and the adhesive resin layer 30, which is caused by expansion of the adhesive film 50 in the in-plane direction, the semiconductor chip 70 can be picked up from the adhesive film 50.

The flexible resin layer 20 is not particularly limited as long as it can be expanded in the in-plane direction; however, it is preferable to be excellent in properties such as flexibility and stretchability and the like, and to have the heat resistance so as to maintain the adhesiveness between the heat-resistant resin layer 10 and the adhesive resin layer 30 in a case of the operation confirmation of the semiconductor chip at high temperature or low temperature.

Examples of the flexible resin constituting the flexible resin layer 20 include one or two or more selected from the group consisting of polyester elastomer, polyamide elastomer, polyimide elastomer, and polybutylene terephthalate.

According to JIS K7161, the tensile elastic modulus (E') at 160° C. of the flexible resin layer 20 measured under the conditions of a sample width of 10 mm, a distance between chucks of 30 mm, and a pulling rate of 300 mm/min is preferably equal to or more than 1 MPa and equal to or less than 300 MPa and more preferably equal to or more than 5 MPa and equal to or less than 150 MPa. In doing so, favorable characteristics such as flexibility and stretchability of the flexible resin layer 20 can be maintained, and the thermal expansion of the adhesive film 50 in a case of the operation confirmation step of the semiconductor chip 70 at high temperature or low temperature can further be suppressed.

The melting point of the flexible resin layer 20 is preferably equal to or more than 100° C. and equal to or less than 250° C.

By using such a flexible resin layer 20, deformation of the adhesive film 50 at the time of high-temperature or low-temperature operation confirmation test can be further suppressed.

The thickness of the flexible resin layer 20 is not particularly limited, and is preferably, for example, equal to or more than 10 μm and equal to or less than 500 μm, more preferably equal to or more than 20 μm and equal to or less than 300 μm, still more preferably equal to or more than 30 μm and equal to or less than 250 μm, and particularly preferably equal to or more than 50 μm and equal to or less than 200 μm.

In the adhesive film 50 according to the present embodiment, a release film may be further stacked on the adhesive resin layer 30. As the release film, for example, a polyester film and the like subjected to release treatment can be mentioned.

The total light transmittance of the adhesive film 50 according to the present embodiment is preferably equal to or more than 85%, more preferably equal to or more than 90%. In doing so, transparency can be imparted to the adhesive film 50. By setting the total light transmittance of the adhesive film 50 to equal to or more than the above-mentioned lower limit value, the adhesive resin layer 30 can be more effectively irradiated with radiation in a case where the adhesive film 50 according to the present embodiment is irradiated with radiation, and thus the radiation irradiation efficiency can be improved. The total light transmittance of the adhesive film 50 may be measured according to JIS K 7105 (1981).

Next, an example of a method for manufacturing an adhesive film 50 according to the present embodiment will be described. First, a flexible resin layer 20 is formed on one surface of the heat-resistant resin layer 10 by an extrusion laminating method. Next, an adhesive coating solution is applied onto the flexible resin layer 20 and dried, whereby the adhesive resin layer 30 is formed, and an adhesive film 50 is obtained.

Further, the heat-resistant resin layer 10 and the flexible resin layer 20 may be prepared by coextrusion molding, or the film-shaped heat-resistant resin layer 10 and the film-shaped flexible resin layer 20 may be prepared by laminating one another.

2. Method for Manufacturing Semiconductor Device

Next, each step of the method for manufacturing the semiconductor device according to the present embodiment will be described.

(Step (A))

First, a structure 100 including an adhesive film 50 having a radiation-curable adhesive resin layer 30 and one or two or more semiconductor chips 70 adhered to the adhesive resin layer 30 is prepared.

Such a structure may be produced, for example, by adhering a semiconductor substrate to the adhesive resin layer 30 of the adhesive film 50 and then dicing the semiconductor substrate on the adhesive film 50 into the semiconductor chip 70.

Hereinafter, a method for manufacturing the structure 100 will be described.

First, a semiconductor substrate is adhered to the adhesive resin layer 30 of the adhesive film 50.

Examples of the semiconductor substrate to be adhered to the adhesive film 50 include substrates (for example, wafers) formed of materials such as silicon, germanium, gallium-arsenic, gallium-phosphorus, gallium-arsenic-aluminum, and the like.

Further, as the semiconductor substrate, it is preferable to use a semiconductor substrate having a circuit formed on its surface.

The adhering of the adhesive film 50 may be performed by a human hand, but is usually performed by an automatic adhering apparatus equipped with a roll-shaped surface protective film.

The temperature of the adhesive film 50 and the semiconductor substrate at the time of adhering is not particularly limited and is preferably 25° C. to 80° C.

The pressure between the adhesive film 50 and the semiconductor substrate at the time of adhering is not particularly limited and is preferably 0.3 MPa to 0.5 MPa.

Next, the semiconductor substrate on the adhesive film 50 is diced into the semiconductor chip 70.

"Dicing" referred to here include, (A) an operation of dividing a semiconductor substrate by providing a cut having the same depth as the semiconductor substrate with respect to the semiconductor substrate to obtain a plurality of divided semiconductor chips (hereinafter also referred to as "full cut dicing") and (B) an operation of obtaining a plurality of semiconductor chips by laser light irradiation to provide a modified region which does not lead to the division of the semiconductor substrate, to the semiconductor substrate (hereinafter also referred to as "stealth dicing").

The dicing may be performed by using a dicing blade (dicing saw), laser light, or the like.

In a case where dicing is a full cut dicing, the semiconductor substrate is divided into a plurality of semiconductor chips by dicing.

On the other hand, in a case where the dicing is a stealth dicing, the semiconductor substrate does not be divided into a plurality of semiconductor chips only by the dicing, the semiconductor substrate is divided by an expansion of the adhesive film 50 after the dicing, and a plurality of divided semiconductor chips are obtained. The expansion of the adhesive film 50 in a case of stealth dicing may be performed before the step (B) or after the step (B).

Note that the semiconductor chip 70 in the step (A) includes both of the plurality of divided semiconductor chips obtained by the full cut dicing and the plurality of semiconductor chips before the division obtained by the stealth dicing.

(Step (B))

Next, the heat resistance of the adhesive resin layer 30 is improved by irradiating the adhesive film 50 with the radiation to crosslink the adhesive resin layer 30.

The resin layer is irradiated with radiation, for example, from the surface of the adhesive film 50 opposite to the surface to which the semiconductor chip 70 is adhered.

In a case of using ultraviolet rays as radiation, the irradiation dose of ultraviolet rays of the adhesive film 50 is preferably equal to or more than 50 mJ/cm$^2$ and more preferably equal to or more than 100 mJ/cm$^2$.

In a case where the dose of ultraviolet rays is equal to or more than the above lower limit value, the heat resistance of the adhesive resin layer 30 can be further improved. As a result, deformation and melting of the adhesive resin layer 30 are further suppressed, and the positional deviation of the semiconductor chip 70 can be further suppressed.

The upper limit of the irradiation dose of ultraviolet rays of the adhesive film 50 is not particularly limited, and is, for example, equal to or less than 1500 mJ/cm$^2$, preferably equal to or less than 1200 mJ/cm$^2$ from the viewpoint of productivity.

Ultraviolet radiation may be performed using, for example, a high pressure mercury lamp or an LED.

(Step (C))

Next, the operation of the semiconductor chip 70 is confirmed in a state of being adhered to the adhesive resin layer 30.

For example, as shown in FIG. 3, the operation confirmation of the semiconductor chip 70 may be performed by placing the structure 100 on the inspection table 90 and using a known semiconductor test apparatus.

For example, a contact terminal 95 connected to the tester is brought into contact with an electrode 75 of the semiconductor chip 70. As a result, an operation power, an operation test signal, and the like are exchanged between the semiconductor chip 70 and the tester to determine whether operation characteristics of the semiconductor chip 70 are good or bad.

In step (C), it is preferable to confirm the operation of the semiconductor chip 70 under a temperature environment equal to or less than 0° C. or equal to or more than 50° C. and equal to or less than 200° C., more preferable to confirm the operation of the semiconductor chip 70 under a temperature environment equal to or more than 60° C. and equal to or less than 180° C., and still more preferable to confirm the operation of the semiconductor chip 70 under a temperature environment equal to or more than 80° C. and equal to or less than 160° C.

In doing so, it is possible to accelerate a deterioration of the semiconductor chip in which a factor that may cause a defect is present, to cause an initial defect of the semiconductor chip at an early stage and to remove the defective product. As a result, a semiconductor chip 70 with excellent reliability with high yield can be obtained.

For example, the temperature environment can be set by placing the structure 100 in a constant temperature reservoir or an oven or heating the structure with a heater provided on the inspection table 90 or the like.

(Step (E))

In a case where the adhesive film 50 has the heat-resistant resin layer 10, the flexible resin layer 20, and the adhesive resin layer 30 in this order, it is preferable to further perform the step (E) of peeling the heat-resistant resin layer 10 from the adhesive film 50 after the step (C).

Peeling of the adhesive film 50 may be performed by a hand, but is typically performed by an apparatus called an automatic peeling machine.

Since the heat-resistant resin layer 10 having an inferior stretchability and flexibility is removed by performing the step (E) after the step (C), in the step (D), the stretchability and flexibility of the film including the adhesive resin layer 30 and the flexible resin layer 20 becomes favorable, and thus the pickup of the semiconductor chip 70 in the step (D) can be performed more easily.

(Step (D))

Next, after the step (C), the semiconductor chip 70 is picked up from the adhesive resin layer 30.

By this pickup, the semiconductor chip 70 can be peeled from the adhesive film 50.

The semiconductor chip 70 can be picked up by a known method.

In step (D), in a state in which the region to which the semiconductor chip 70 is adhered in the adhesive resin layer 30 is expanded in the in-plane direction of the film and the interval between adjacent semiconductor chips 70 is enlarged, it is preferable to pick up the semiconductor chip 70 from the adhesive resin layer 30.

In doing so, since the interval between adjacent semiconductor chips 70 is enlarged, the semiconductor chip 70 can be easily picked up from the adhesive film 50. Furthermore, since the adhesive force between the semiconductor chip 70 and the adhesive resin layer 30 is lowered by the shear stress between the semiconductor chip 70 and the adhesive resin layer 30, which is caused by expansion of the adhesive film 50 in the in-plane direction, it is easy to pick up the semiconductor chip 70 from the adhesive film 50.

(Other Steps)

The method for manufacturing a semiconductor device according to the present embodiment may include other steps than those described above. As other steps, known steps in a method for manufacturing a semiconductor device may be used.

For example, after performing the step (D), any step typically performed in electronic component manufacturing steps such as a step of mounting the obtained semiconductor chip on a circuit board, a wire bonding step, and a sealing step may be further performed.

In a case of using a semiconductor substrate having a circuit surface only on one surface as a semiconductor substrate, a sealing step for sealing the circuit surface of the semiconductor substrate may be further included.

In the sealing step, for example, a protective layer is formed on the circuit surface of the semiconductor substrate to which the adhesive film 50 is adhered, thereby sealing the circuit surface inside. In that case, the semiconductor substrate whose circuit surface is sealed is diced in the dicing step after the sealing step.

Note that the sealing step may be performed before the step of adhering the adhesive film 50 to the semiconductor substrate.

In a case of using a semiconductor substrate having a circuit surface, for example, a step of forming electrodes on a circuit formation surface of a semiconductor substrate and forming a protective film on a non-circuit surface by any typically employed method may be further included. The manufacturing method including the steps of forming the electrode and forming the protective film is also called a Wafer Level Package (WLP).

Further, a step of forming a redistribution layer on the circuit surface of the semiconductor substrate may be further included. A semiconductor device obtained by forming the redistribution layer in a wide area that exceeds the semiconductor chip area is also called a fan-out package.

Although the embodiments of the present invention have been described above, these are examples of the present invention, and various configurations other than those described above may also be adopted.

The present invention is not limited to the above-described embodiments, and variations, improvements, and the like within the scope of achieving the object of the present invention are included in the present invention.

EXAMPLES

Hereinafter, the present invention will be specifically described with reference to Examples, but the present invention is not limited thereto.

Details of the materials used for producing the adhesive film are as follows.

<Heat-resistant Resin Layer>

Heat-resistant resin layer 1: polyethylene terephthalate (PET) film (manufactured by UNITIKA LTD., trade name: Emblet (registered trademark) S-50, melting point: 260° C., decomposition temperature: about 400° C., thickness: 50 μm)

<Flexible Resin for Forming Flexible Resin Layer>

Flexible resin 1: polyester elastomer (manufactured by DU PONT-TORAY CO., LTD., trade name: Hytrel (registered trademark) 5557, melting point: 208° C.)

<Adhesive for Forming Adhesive Resin Layer>

(Adhesive 1 (ultraviolet crosslinking type acrylic adhesive)) 48 parts by mass of ethyl acrylate, 27 parts by mass of 2-ethylhexyl acrylate, 20 parts by mass of methyl acrylate, 5 parts by mass of glycidyl methacrylate, and 0.5 parts by mass of benzoyl peroxide as a polymerization initiator were mixed. The mixture was added dropwise to a nitrogen-purged flask containing 65 parts by mass of toluene and 50 parts by mass of ethyl acetate at 80° C. over 5 hours while stirring, and further stirring was carried out for 5 hours for reaction. After completion of the reaction, the solution was cooled, 25 parts by mass of xylene, 2.5 parts by mass of acrylic acid, and 1.5 parts by mass of tetradecylbenzylammonium chloride were added to the solution, and the solution was reacted at 80° C. for 10 hours under air blow to obtain an acrylic acid ester copolymer solution into which the photopolymerizable carbon-carbon double bond was introduced.

Into the solution, 7 parts by mass of benzoin as the ultraviolet polymerization initiator, 2 parts by mass of an isocyanate crosslinking agent (manufactured by Mitsui Chemicals, Inc., trade name: OLESTER P49-75S), and 15 parts by mass of dipentaerythritol hexaacrylate (manufactured by TOAGOSEI CO., LTD., trade name: ARONIX M-400) as the low molecular weight compound having two or more photopolymerizable carbon-carbon double bonds in one molecule were added with respect to 100 parts by mass of the copolymer (solid content) to obtain the adhesive 1 (the ultraviolet-crosslinking type adhesive coating solution).

Example 1

On the heat-resistant resin layer 1, a film (thickness: 110 μm, tensile elastic modulus at 160° C.: 40 MPa (measured in accordance with JIS K 7161 under the conditions of a sample width of 10 mm, a distance between chucks 30 mm, and a pulling rate of 300 mm/min) composed of the flexible resin 1 to form the flexible resin layer was laminated.

Subsequently, the coating solution of the adhesive 1 was applied onto the flexible resin layer of the obtained film and then dried to form the adhesive resin layer having a thickness of 20 μm to obtain the adhesive film.

Next, the adhesive film was adhered to the silicon wafer for the adhesive resin layer to come in contact with the silicon wafer, and the structure was prepared (the step (A)).

Subsequently, the adhesive film of the structure is irradiated with ultraviolet rays having a main wavelength of 365 nm under conditions of an irradiation intensity of 108 mW/cm$^2$ and an ultraviolet rays dose of 540 mJ/cm$^2$ using a high pressure mercury lamp (UVX-025285 1 AJA 02 manufactured by Ushio Inc.) in an environment of 25° C. to cause crosslinking in the adhesive resin layer (the step (B)).

Next, the obtained structure was subjected to a heat treatment on a hot plate at 150° C. for 0 to 6 hours. At this time, the heat-resistant resin layer side was set on the hot plate side. Here, the heat treatment corresponds to the step (C) of confirming the operation of the semiconductor chip in a state of being adhered to the adhesive resin layer in the high temperature environment after the step (B).

Next, the heat treatment was performed for a certain period of time, and then the peeling strength between the adhesive film and the silicon wafer was measured. Here, the peeling test between the adhesive film and the silicon wafer corresponds to the step (D) of picking up the semiconductor chip from the adhesive resin layer after the step (C).

The peeling strength between the adhesive film and the silicon wafer was measured by the following method. First, using a tensile tester (manufactured by Toyo Seiki Seisaku-sho, Ltd., trade name: Strograph), the adhesive film was peeled from the silicon wafer in the 180 degree direction under the conditions of 25° C. and a tension rate of 100 mm/min, the strength at that time (N/25 mm) was measured twice, and the average value thereof was taken as the peeling strength.

The obtained results are shown in Table 1.

[Comparative Example]1

The peeling strength between the adhesive film and the silicon wafer was obtained in the same manner as in Example 1 except that ultraviolet ray irradiation was not performed before the heat treatment was performed to the structure, and ultraviolet ray irradiation was performed after the structure was subjected to heat treatment (that is, the step(b) was performed after the step (c)). The obtained results are shown in Table 1.

TABLE 1

| | Peeling Strength [N/25 mm] Heating Time [h] | | | | |
|---|---|---|---|---|---|
| | 0.0 | 1.0 | 2.0 | 4.0 | 6.0 |
| Example 1 | 0.3 | 0.5 | 0.6 | 0.8 | 0.8 |
| Comparative Example 1 | 0.2 | 1.7 | 2.2 | 2.8 | 3.1 |

In Example 1 in which the step (B) was performed before the step (C), the strengthening of the adhesive force between the adhesive film and the silicon wafer was suppressed, and it was possible to easily peel the silicon wafer from the adhesive film. On the other hand, in Comparative Example 1 in which the step (B) was not performed before the step (C), the adhesive force between the adhesive film and the silicon wafer increased greatly with the heating time.

That is, according to the method for manufacturing the semiconductor device of Example 1 in which the steps (A) to (D) are performed and the step (B) is performed before the step (C), compared to the method of manufacturing the semiconductor device of Comparative Example 1 in which the step (B) is not performed before the step (C), it can be understood that the semiconductor chip can be picked up with a high precision.

This application claims priority based on Japanese Patent Application No. 2016-068856 filed on Mar. 30, 2016, the disclosure of which is incorporated herein in its entirety.

The invention claimed is:

1. A method for manufacturing a semiconductor device comprising:
   a step (A) of preparing a structure including an adhesive film having a radiation-curable adhesive resin layer, and one or two or more semiconductor chips adhered to the adhesive resin layer;
   a step (B) of, after the step (A), irradiating the adhesive film in the structure with a radiation to crosslink the adhesive resin layer;
   a step (C) of, after the step (B), confirming an operation of the semiconductor chips in a state of being adhered to the adhesive resin layer; and
   a step (D) of, after the step (C), picking up the semiconductor chips from the adhesive resin layer.

2. The method for manufacturing a semiconductor device according to claim 1,
   wherein in the step (C), the operation confirmation of the semiconductor chips is performed under a temperature environment equal to or less than 0° C., or equal to or more than 50° C. and equal to or less than 200° C.

3. The method for manufacturing a semiconductor device according to claim 1,
   wherein in the step (D), in a state where a region to which the semiconductor chips is adhered in the adhesive resin layer is expanded in an in-plane direction of the film to enlarge an interval between the semiconductor chips adjacent to each other, the semiconductor chips are picked up from the adhesive resin layer.

4. The method for manufacturing a semiconductor device according to claim 1,
   wherein the adhesive film has a heat-resistant resin layer, a flexible resin layer, and the adhesive resin layer in this order,
   the method further comprising:
   a step (E) of, after the step (C), peeling the heat-resistant resin layer from the adhesive film.

5. The method for manufacturing a semiconductor device according to claim 4,
   wherein a melting point of the heat-resistant resin layer is equal to or more than 200° C., or the heat-resistant resin layer has no melting point.

6. The method for manufacturing a semiconductor device according to claim 4,
   wherein a melting point of the flexible resin layer is equal to or more than 100° C. and equal to or less than 250° C.

7. The method for manufacturing a semiconductor device according to claim 4,
   wherein the heat-resistant resin constituting the heat-resistant resin layer contains one or two or more selected from the group consisting of polyimide, polyamide, and polyester.

8. The method for manufacturing a semiconductor device according to claim 4,
   wherein the flexible resin constituting the flexible resin layer contains one or two or more selected from the group consisting of a polyester elastomer, a polyamide elastomer, a polyimide elastomer, and a polybutylene terephthalate.

9. The method for manufacturing a semiconductor device according to claim 1,
   wherein the adhesive constituting the adhesive resin layer contains one or two or more selected from the group consisting of a (meth)acrylate adhesive, a silicone adhesive, a urethane adhesive, an olefin adhesive, and a styrene adhesive.

10. The method for manufacturing a semiconductor device according to claim 1,
    wherein a total light transmittance of the adhesive film is equal to or more than 85%.

* * * * *